Jan. 31, 1967 S. S. FLASCHEN ETAL 3,301,706

PROCESS OF FORMING AN INORGANIC GLASS COATING
ON SEMICONDUCTOR DEVICES

Original Filed May 11, 1961 2 Sheets-Sheet 1

INVENTORS
Steward S. Flaschen
Robert J. Gnaedinger, Jr.
BY Mueller & Aichele
ATT'YS.

PROCESS OF FORMING AN INORGANIC GLASS COATING ON SEMICONDUCTOR DEVICES

Original Filed May 11, 1961 2 Sheets-Sheet 2

INVENTORS
Steward S. Flaschen
Robert J. Gnaedinger, Jr.
BY Mueller & Aichele
ATT'YS.

3,301,706
PROCESS OF FORMING AN INORGANIC GLASS COATING ON SEMICONDUCTOR DEVICES

Steward S. Flaschen, Darien, Conn., and Robert J. Gnaedinger, Jr., Port Credit, Ontario, Canada, assignors to Motorola, Inc., Chicago, Ill., a corporation of Illinois
Continuation of application Ser. No. 109,439, May 11, 1961. This application July 7, 1965, Ser. No. 470,043
7 Claims. (Cl. 117—217)

The application is a continuation of application Serial No. 109,439, filed May 11, 1961.

This invention relates generally to the protection of surfaces of semiconductor material in solid state electronic devices such as transistors and diodes. In particular, the invention relates to the acceleration of a process of oxidizing the surface of semiconductor material to form an inorganic glass coating.

One of the known ways of protecting a semiconductor unit of an electronic device is to form an inorganic glass coating at the surface of the semiconductor material which covers the exposed portion of each junction in the unit. An inorganic glass coating has certain advantages as compared to other protective coatings for semiconductor material. For example, an inorganic glass coating is less pervious to moisture than organic substances which have been used for encapsulation in some commercially available devices. The glass is much less likely to deteriorate with age than organic materials, and is less likely to contain ionic substances which can contaminate the underlying semiconductor. Also, ionic impurities have less mobility in an inorganic glass film than in an organic film, and thus they are not as likely to drift in surface fields produced by a junction during operation of an electronic device.

It is possible to form a protective glass coating on semiconductor material by oxidizing the material at its surface, but this method has had some serious limitations. In general, it has been necessary to carry out the oxidation at a relatively high temperature. For example, silicon material has typically been oxidized at temperatures in the range from 900° C. to 1100° C. When a semiconductor unit which contains doping impurities is heated at these temperatures for an appreciable time, the doping impurities diffuse within the semiconductor material. The doping impurities form junctions in the semiconductor unit whose relative positions are critical in obtaining a given device operation. When the doping impurities diffuse due to high temperature heating in the oxidation processing referred to above, the junctions in the semiconductor unit are displaced, thus changing the device parameters and sometimes even making the semiconductor unit unsatisfactory for use in an electronic device.

The rate limiting factor in the oxidation of silicon in an oxygen-containing atmosphere at appreciable oxide thickness is either (1) the diffusion of silcon through the oxide film to the oxidizing atmosphere at the surface of the film, (2) the diffusion of oxygen through the oxide film to the elemental silicon at the silicon-glass interface, or (3) both of these diffusion mechanisms operating simultaneously. Such diffusion is slow when silicon oxidizes in normal thermal oxidation conditions, and this can be related to the fact that the bonds between the silicon atoms and the oxygen atoms in the oxide film are very strong. Consequently, a high degree of thermal energy is required to stretch these bonds sufficiently for appreciable diffusion of oxygen and/or silicon to occur, and the film tends to limit its own growth increasingly as the film becomes thicker. These factors have made it necessary to carry out thermal oxidation of silicon at high temperatures and for relatively long times in order to build up an adequate film thickness.

In the case of germanium, some of the factors involved in oxidation are the same as for silicon. The germanium-oxygen system, like the silicon-oxygen system, strongly favors oxidation up to temperatures extending well beyond the melting point of the semiconductor material. The rate of formation of a surface oxide film on germanium is limited by the film itself for the same reasons as described above in connection with the thermal oxidation of silicon. A complicating factor in the oxidation of germanium is that above a temperature of about 550° C., the volatility of germanium monoxide is appreciable, and the build-up of a protective germanium dioxide film is impeded by thermal etching.

Stated briefly, the present invention provides a way of accelerating the oxidation of silicon and germanium by modifying and weakening the interatomic bonds in the network structure of the oxide glass. This network modification is accomplished by incorporating in the glass while it forms one or more inorganic materials that allow higher mobility of the atoms entering into the oxidation reaction. The inorganic material which is introduced into the glass will be referred to herein as an accelerating agent because its ultimate effect is to increase, or accelerate, the rate of oxidation. The increase in oxidation rate is accompanied by an increase in the thickness of the oxide film which is formed for a given time and temperature of oxidation.

The inorganic glass coating has two primary functions: (1) It protects the underlying semiconductor material from the environment about it, particularly from moisture in that environment; and (2) it stabilizes the surface or boundary of the semiconductor material rendering it less subject to change with time, temperature and electrical biasing. The glass coating protects and stabilizes the semiconductor unit to such an extent that for some applications it is possible to encapsulate the unit with ordinary organic encapsulating material, and in some cases, to eliminate all encapsulation other than the glass coating itself.

The invention will be described with reference to the accompanying drawings in which.

Figure 1:
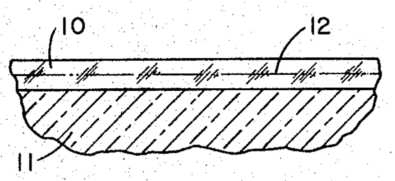
FIG. 1 is a schematic view for illustrative purposes only, showing the surface region of a body of semiconductor material which has been converted to glass by an accelerated oxidation process in accordance with the invention.

In practicing the method of the invention, a semiconductor body, which may be of silicon or germanium material, is heated and exposed to an atmosphere which contains oxygen and an accelerating agent such that a surface region of the semiconductor body is converted to glass by oxidation. The accelerating agent is an inorganic material which is introduced into the glass while it is forming and serves to increase the rate of oxidation at a given temperature, as pointed out above.

By introducing a selected inorganic material into the glass, it is possible to form any suitable thickness of glass by oxidation at temperatures below 750° C., and even below 500° C. Of course, the glass may be formed at higher temperatures if desired, but the ability to form it at such low temperatures is very advantageous. It means that a semiconductor unit which contains doping impurities may be oxidized without causing undue diffusion of the impurities and thus degrading desired electrical properties of the unit. It also means that a greater variety of materials for forming electrical contacts to the semiconductor unit is available. It is desirable to form contacts or electrodes on the semiconductor unit before the glass film is formed, but high oxidation temperatures will degrade many contact materials unduly. Since it is possible to carry out the oxidation at lower temperatures by including a suitable accelerating agent in the glass which is formed, there is less degradation of the contacts and the making of electrical connections to the contacts, for instance by soldering, is simplified.

The accelerating agent should be an inorganic material which decreases the viscosity of the glass film which is formed by oxidation of the silicon or germanium starting material. The resulting glass film may be binary, ternary, or quaternary oxide system depending on the chemical nature of the accelerating agent. The glass film which includes the accelerating agent will have a considerably lower melting point or eutectic temperature than pure silicon oxide or germanium oxide glass. The accelerating material may substitute in the network structure of the glass at either the cation sites or the anion sites, or both, and it acts to modify and weaken the interatomic bonding structure of the glass film to increase the diffusion rates of the components of the oxidation reaction.

There are a number of materials and combinations of materials which satisfy the above criterion for selection of an accelerating agent. Suitable accelerating materials are lead, the halogens, and the alkaline earth metals. Certain other materials may be used together with lead to form ternary and quaternary glasses, and examples are the elements of Group 3*a* and Group 5*a* of the Periodic Table. Of course, in order to introduce these accelerating materials into the glass, it may be desirable to use them in the form of compounds, such as oxides and halides which can be vaporized conveniently, and of course mixtures containing more than one accelerating agent can be used.

A list of the oxide glass systems formed by the acceleratig materials just referred to is set forth below. In this list, the semiconductor component of the glass, which may be either silicon or germanium is designated "(Si or Ge)" and the other components are identified by the usual chemical symbols and names.

GLASS SYSTEMS FORMED BY ACCELERATED OXIDATION OF SILICON OR GERMANIUM (Si or Ge)—O—lead (Pb).
(Si or Ge)—O—halogen (Cl, Br, I).
(Si or Ge)—O—Pb—halogen (Cl, Br, I).
(Si or Ge)—O—Pb—alkali metal (Li, Na, K).
(Si or Ge)—O—Pb—group 3*a* element (B, Al, Ga, In, Tl).
(Si or Ge)—O—Pb—group 5*a* element (P, As, Sb, Bi).
(Si or Ge)—O—alkaline earth metal (Be, Mg, Ca, Sr, Ba).
(Si or Ge)—O—alkaline earth metal-alkali metal.
(Si or Ge)—O—Zn—halogen (Cl, Br, I).
(Si or Ge)—O—Cd—halogen (Cl, Br, I).
(Si or Ge)—O—Sn—halogen (Cl, Br, I).
Si—O—Ge—halogen (Cl, Br, I).

FIG. 1 of the drawings illustrates schematically a glass coating formed by accelerated oxidation on semiconductor material. The glass coating 10 protects the underlying semiconductor material 11 from the environment about it and from changes in that environment. The glass is a rigid inorganic film in which atomic and ionic rearrangements are not likely to occur under the influence of heat and electric fields, and because of this the glass coating has a stabilizing effect on a semiconductor unit.

A glass coating 10 of suitable thicknes for protective purposes can be formed on silicon or germanium by oxidizing it at a temperature below 750° C., and in some cases below 400° C., provided that the atmosphere in which the oxidation is carried out is such as to form one of the glass compositions listed above. For example, in oxidizing silicon or germanium the oxidation may be carried out at a temperature of 400° C. to 750° C. for a time of from one-half to four hours in an atmosphere containing oxygen and one or more of the accelerating materials listed above.

Figure 2:
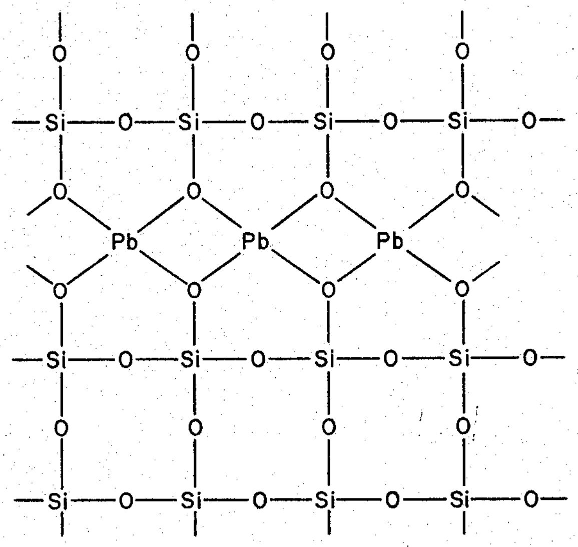
FIG. 2 is a schematic illustration of the atomic structure of a glass coating of the type shown in FIG. 1 wherein the glass is a lead silicate material.
Figure 3:
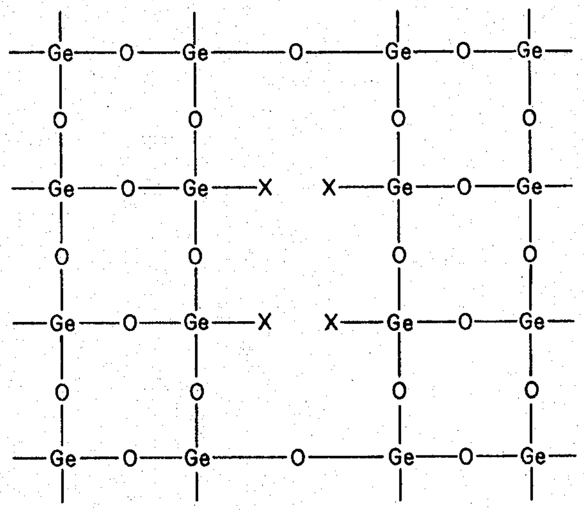
FIG. 3 is a schematic illustration similar to FIG. 2 for a germanium oxide glass containing a halogen material.

FIGS. 2 and 3 illustrate schematically the manner in which the accelerating agent is incorporated in the glass and acts to weaken the bond structure of the glass. FIG. 2 represents a lead silicate glass, and FIG. 3 represents a germanium oxide glass containing a halogen such as chlorine, bromine or fluorine. The atoms of silicon, oxygen and lead in the case of FIG. 2, and the atoms of germanium, oxygen and halogen in the case of FIG. 3, are represented by the appropriate chemical symbols. The bonds between the atoms are represented by solid lines. It will be understood that FIGS. 2 and 3 are not necessarily rigorous, but they do illustrate the principles of the invention.

It may be seen from FIG. 2 that each silicon atom (Si) bonds with four oxygen atoms (O). However, the lead atoms can only form two valence bonds instead of four in the case of silicon. If each lead atom bonds with four oxygen atoms as shown in FIG. 2, then these must be shared bonds which are weaker than the unshared silicon-oxygen bonds. If the lead atoms were to bond with only two oxygen atoms, the cross-linking structure of the glass would be interrupted, but it is considered to be more likely that the lead-oxygen bonds are shared. In either case, the bonding structure of the glass is weaker than a pure silicon-oxygen glass, and less thermal energy required to diffuse oxygen and/or silicon in the glass film than in a pure silicon oxide glass. This explains why the oxidation processing can be carried out at such comparatively low temperatures as the 400° C.–750° C. range mentioned above, and even lower temperatures are possible. The effect of introducing lead into a germanium-oxygen system is the same as in the case of the silicon-oxygen-lead system shown in FIG. 2.

The accelerating agent may substitute at the anion (negative) sites in the network structure of the glass. The germanium-oxygen-halogen system shown in FIG. 3 is representative of such a system. The halogen atoms (x)

can have only one valence bond with the germanium atoms (Ge), and thus the cross-linking structure of the glass is interrupted. Also, some of the germanium-oxygen bonds may be stretched as shown in FIG. 3. The result is that less thermal energy is required to diffuse oxygen and/or germanium in the glass, and consequently the oxidation rate is acelerated by introducing the halogen material into the glass.

It may be noted in FIG. 1 that the original surface of the semiconductor material is at the dashed line 12, and the glass material penetrates from this original surface into the bulk of the semiconductor body 11. The accelerating agent increases the volume of the glass so that the exterior surface of the glass is displaced outwardly from the original semiconductor surface at 12.

The glass should be thicker than the oxide film which normally forms on the surface of silicon or germanium when it is exposed to a normal room atmosphere. On silicon, for example, such an oxide film is no more than about 50 angstrom units thick. The exact minimum thickness value for a protective glass film on silicon or germanium is not known, but it is thought that the film should be at least about 300 angstrom units thick for most applications. On the other hand, glass films over 100,000 angstrom units thick have been formed by accelerated oxidation in accordance with the invention. Up to the present time, the best results have been obtained with glass coatings of a thickness in the range from about 1000 to about 10,000 angstrom units.

GLASS COATING OF SILICON SEMICONDUCTOR UNITS

Figure 4:
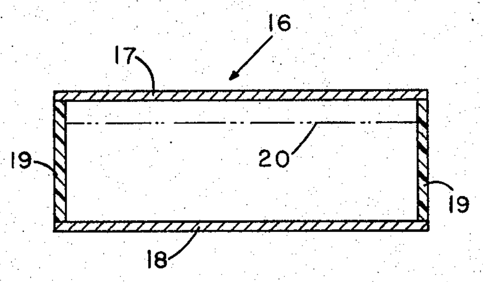
FIG. 4 shows a cross-section of a semiconductor unit with conductive electrodes on two of its sides and with glass material formed at the peripheral surface area which is not covered by the electrodes.

The glass coating of silicon rectifier die units by accelerated oxidation will be described with reference to FIGS. 4 and 7 as one example of how the accelerated oxidation processing of the invention may be applied to device fabrication. The silicon die 16 of FIG. 4 has metallic electrodes 17 and 18 on its two major sides. Rectifier units of this general type and methods for fabricating them are described in U.S. Patent No. 2,962,394 of R. J. Andres assigned to the present assignee. There is a glass coating 19 at the peripheral surface of the die which is not covered by the electrodes. The drawing in FIG. 4 is wholly schematic because both the glass coating 19 and the electrode coatings 17 and 18 are so thin compared to the die dimensions that they cannot be drawn to accurate scale in such a limited space. The silicon die 16 may contain one or more junctions, and a PN junction is represented by the dashed line 20 in FIG. 4.

The starting material for fabricating a glass coated silicon rectifier die of the type shown in FIG. 4 is a silicon wafer which has a PN rectifying junction in it. The junction may be formed in the silicon material by diffusion of proper doping impurities into a wafer. Metallic material capable of making ohmic contact to the silicon wafer on opposite sides of the junction may be applied to the wafer for example by electroplating, by electroless plating, by evaporation or by sputtering techniques. Examples of suitable contact materials are nickel, gold, rhodium, platinum, iridium and palladium.

After the contact material has been applied to the wafer, it is divided up into individual units known as dice. The dicing step may be accomplished by scribing the wafer so as to define the dice, and then breaking the wafer along the scribed line. Another satisfactory way of forming such dice is to mask the die areas of the wafer with protective material such as wax or photo-resist material, and then etch away the material between the masked areas with an etching agent such as a hydrofluoric acid-nitric acid mixture which cuts through the wafer at the areas not protected by the resist. It may be necessary to etch through the metallic layer with aqua regia or some other suitable etching agent prior to etching through the silicon. After cleaning the dice, they are ready for the oxidation processing which forms the glass film 19 shown in FIG. 4.

Figure 7:
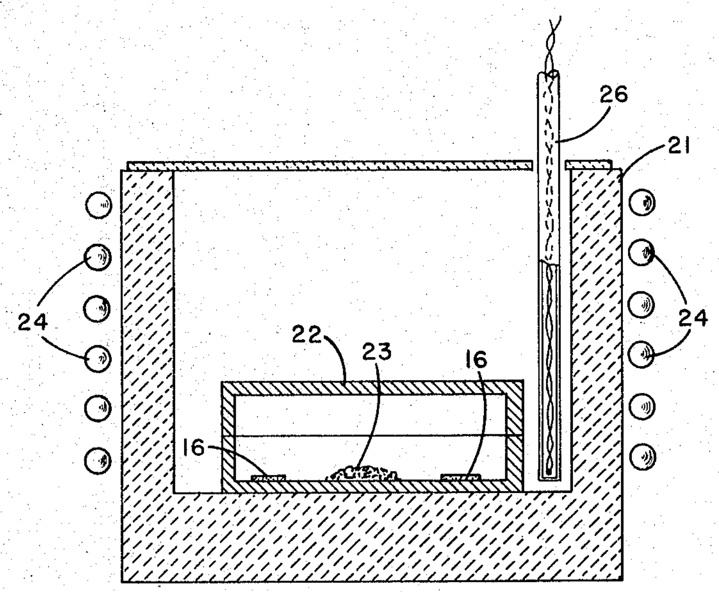
FIG. 7 is a sectional view of suitable apparatus for carrying out the accelerated oxidation process of the invention.

The oxidation step may be carried out in an ordinary furnace, and a typical furnace 21 is illustrated in FIG. 7. Inside the furnace there is a reaction chamber 22 formed by two cup-shaped members made of alumina.

The accelerating agent is introduced into the atmosphere in the chamber 22 from the source material at 23. For example, where lead is the accelerating agent, a quantity of lead oxide material in powdered form is placed in the bottom of the chamber 22. The dice 16 are placed around the source material. The furnace is heated by an electrical resistance heater 24, although any suitable heating element may be used. The temperature in the furnace is measured by means of a thermocouple 26.

It is satisfactory to have an atmosphere of air in the chamber 22. When the furnace is heated, lead oxide vapors mingle with the air, and the lead is introduced into the glass which forms on the dice 16 by oxidation.

Although air is a suitable oxidizing atmosphere, other gases may be used. For example, an inert gas containing oxygen may be provided in the furnace instead of air. Also, the oxidizing gas or gases may be passed through the furnace from an external source, and such flow-type furnaces are well known in the semiconductor art and are commonly used for diffusion processing.

In some cases it is desirable to support the work pieces which are to be coated directly over the source material, particularly if the area which is to be coated with glass is a flat surface. Portions of work pieces may be masked to prevent them from oxidizing. It may be noted that the metallic material at 17 and 18 on the die unit 16 of FIG. 4 prevents oxidation of the underling semiconductor material, and thus serves a masking function.

The specific temperature at which the accelerated oxidation process is carried out depends on how thick a glass film is desired. In general, it is desirable to carry out the accelerated oxidation at a relatively low temperature in order to minimize diffusion of impurities in the silicon material and to minimize degradation of the electrode materials. Glass films of high quality have been formed by oxidizing with gas containing oxygen and the selected accelerating material at temperatures in the range from about 400° C. to about 750° C.

Glass coated silicon rectifier dice of the type shown in FIG. 4 have been subjected to various tests in order to determine the effectiveness of the glass coating formed by accelerated oxidation as a protective and stabilizing medium. Some illustrative results from these tests will be presented by way of example.

In temperature aging tests, the glass coated rectifier dice have been aged in conditions of high temperature with a reverse electrical bias applied to the units. In these conditions, the tendency for any ionic impurities in the glass to drift in the electric field at the junction 20 (FIG. 2) is promoted. Such drifting of ionic impurities would tend to make the reverse current of the units change with age. Units having a glass coating over the junction formed by accelerated oxidation in accordance with the previous description have shown no appreciable degradation in reverse current upon aging in excess of one thousand hours.

*Example 1*

Twenty-five silicon rectifier dice of the type shown in FIG. 4 were prepared from N-type silicon material having a P-type diffused region forming a PN junction 20. The dice were 80 mils in diameter and 7 mils thick, and they were provided with metallic contacts 17 and 18 with electrical connections soldered thereto. The bulk N-type material had a resistivity of about 70 ohm-centimeters. A lead-silicate glass film 19 was formed by oxidizing the dice in an atmosphere containing oxygen and lead-oxide vapor at a temperature of 600° C. for three hours. The glass film on the dice was from 2100 to 2600 angstrom units thick.

The glass coated units were baked for stabilization purposes at 175° C. for twenty-four hours, and of the twenty-five units which were prepared, only one had a breakdown voltage less than 900 volts at 10 microamperes of reverse current after the stabilization baking. This unit, which is identified as Sample No. 7 in Table I below, was not aged because of its comparatively low breakdown voltage. The other twenty-four units were aged in an oven at 150° C. with 200 volts of reverse bias continuously applied to the units. Readings of reverse current for each unit taken at 150° C. at selected times in the aging process are presented in Table I.

TABLE I.—HIGH TEMPERATURE AGING DATA, Si —O— Pb GLASS ON SILICON RECTIFIER UNITS

[Reverse Current In Microamperes At 150° C. and 200 Volts Reverse Bias]

| Sample No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| Initial | 33 | 37 | 40 | 36 | 37 | 30 | ---- | 35 | 30 | 53 | 45 | 43 | 31 | 38 | 32 | 200 | 38 | 28 | 56 | 52 | 44 | 38 | 43 | 31 | 39 |
| 130 Hours | 63 | 52 | 87 | 150 | 61 | 53 | ---- | 88 | 100 | 155 | 62 | 60 | 160 | 150 | 45 | 71 | 50 | 80 | 80 | 50 | 115 | 68 | 78 | 60 | 200 |
| 350 Hours | 79 | 55 | 94 | 84 | 78 | 56 | ---- | 260 | 85 | 150 | 68 | 79 | 145 | 200 | 60 | 79 | 60 | 80 | 97 | 60 | 270 | 100 | 78 | 82 | 8,000 |
| 660 Hours | 70 | 44 | 82 | 53 | 57 | 45 | ---- | 260 | 72 | 125 | 52 | 56 | 94 | 180 | 46 | 58 | 45 | 57 | 60 | 47 | 220 | 66 | 52 | 63 | 4,300 |
| 1,000 Hours | 51 | 40 | 72 | 47 | 52 | 36 | ---- | 210 | 53 | 100 | 54 | 58 | 96 | 175 | 51 | 68 | 56 | 54 | 52 | 47 | 170 | 65 | 63 | 71 | 240 |
| 1,500 Hours | 34 | 31 | 43 | 39 | 41 | 32 | ---- | 120 | 43 | 70 | 43 | 40 | 70 | 98 | 31 | 54 | 39 | 42 | 57 | 38 | 110 | 38 | 47 | 53 | 220 |

It may be seen from the above data that the reverse current of all units except unit number 25 remained relatively constant even after 1500 hours of aging, and this indicates that the units were not degraded by surface effects despite the strong field at the junction and the high temperature conditions maintained throughout the aging. The limiting variation in reverse current which most of these units did exhibit is within the range which might be expected from imperfect temperature control.

*Example 2*

Another group of silicon rectifier dice of the type shown in FIG. 4 was provided with a protective glass film 19 containing a mixture of lead and antimony. The silicon dice were 50 mils in diameter and 7.5 mils thick. They were provided with metallic contacts. The accelerated oxidation glassing process was carried out in an atmosphere of air and a mixture of lead oxide and antimony oxide at a temperature of 700° C. for one hour. The units were supported over a mixture of 95% lead oxide powder and 5% antimony oxide powder in a heated furnace, and the lead oxide and antimony oxide vapors from the powder material mixed with the air in the furnace and circulated over the die units.

The units were then aged in an oven with 200 volts of reverse bias continuously applied to them. Units 1 and 2 (Table II) were placed in the oven after units 3 and 4 had aged for approximately 275 hours. Initially the temperature of the oven was maintained at 100° C., but after 700 hours of aging on units 1 and 2 and 975 hours on units 3 and 4, the temperature was increased to 150° C. Readings of reverse current measured at 100° C. and 150° C. at selected times in the aging process are presented in Table II.

TABLE II.—HIGH TEMPERATURE AGING DATA, Si —O— Pb, Sb GLASS ON SILICON RECTIFIER UNITS

| Sample No. | Reverse Current (Microamperes) at 100° C. and Reverse Bias of 200 Volts | | | Reverse Current (Microamperes) at 150° C. and Reverse Bias of 200 Volts | | | |
|---|---|---|---|---|---|---|---|
| | Initial | 700 hrs. | 975 hrs. | Initial | 1,400 hrs. | 2,200 hrs. | 3,300 hrs. |
| 1 | 0.9 | 2.6 | ---- | 20 | 21 | 21 | 17 |
| 2 | 1 | 2.5 | ---- | 20 | 22 | 26 | 16 |
| 3 | 2 | 4.2 | 4.3 | 28 | 23 | 20 | ---- |
| 4 | 1 | 2.3 | 2.1 | 17 | 14 | 10 | ---- |

It may be seen from the data in Table II that the reverse current of the units remained substantially constant at very low levels even after aging for a total of more than 3,000 hours.

*Example 3*

A group of 20 silicon rectifier units of the type shown in FIG. 4 was coated with glass containing lead and antimony in order to confirm the results obtained with the smaller group in Example 2. The dice were approximately 80 mils in diameter and 7.5 mils thick. The resistivity of the N-type bulk material was about 100 ohm-centimeters. The accelerated oxidation processing was carried out at 650° C. for three hours in an atmosphere of air containing lead oxide and antimony oxide vapors. The resulting glass coating on the units was about 500 angstrom units thick. A mixture of lead oxide and antimony oxide powder containing only 0.2% antimony oxide provided the source of the lead and antimony for the glass film. All twenty units initially had a breakdown voltage greater than 1000 volts at 10 microamps of reverse current.

The glass coated units were aged in an oven at 150° C. with 200 volts of reverse bias applied to them. The results presented in Table III below tend to confirm that units having protective silicate glass films modified with lead and antimony have relatively low reverse currents which remain substantially constant as the units age in conditions of high temperature.

TABLE III.—HIGH TEMPERATURE AGING DATA, Si —O— Pb, Sb GLASS ON SILICON RECTIFIER UNITS

[Reverse Current in Microamperes at 150° C. and 200 Volts]

| Sample No. | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| Initial | 21 | 21 | 32 | 30 | 28 | 30 | 37 | 40 | 38 | 33 | 34 | 24 | 40 | 48 | 67 | 48 | 37 | 46 | 48 | 43 |
| 76 Hours | 27 | 27 | 30 | 33 | 26 | 30 | 32 | 39 | 43 | 30 | 34 | 29 | 32 | 33 | 54 | 35 | 28 | 30 | 30 | 29 |
| 240 Hours | 28 | 28 | 34 | 40 | 26 | 27 | 27 | 33 | 40 | 30 | 34 | 30 | 35 | 36 | 63 | 40 | 30 | 36 | 34 | 30 |
| 623 Hours | 30 | 29 | 32 | 40 | 31 | 28 | 27 | 32 | 36 | 26 | 32 | 28 | 33 | 33 | 66 | 44 | 35 | 47 | 46 | 32 |
| 906 Hours | 23 | 22 | 28 | 34 | 29 | 27 | 29 | 33 | 38 | 23 | 30 | 27 | 32 | 32 | 68 | 42 | 33 | 52 | 42 | 30 |

*Example 4*

The high temperature aging tests described in Examples 1 to 3 were conducted without any attempt to control the humidity in the environment of the units during the aging process. Other aging tests have been made at relative humidities ranging from 35% to 90%, and the results of these tests are set forth in Table IV below. The silicon rectifier units on which the tests were made were of the type shown in FIG. 2, and the glass film 19 on the units was a lead-silicate glass prepared by accelerated oxidation. The oxidation was carried out at a temperature of 600° C. for one hour in an atmosphere containing oxygen and lead oxide vapors, and the resulting glass film was about 1300 angstrom units thick. The dice were 50 mils in diameter and 7.5 mils thick, and electrical connections were made to metallic contacts on the major faces of the dice. The resistivity of the N-type bulk silicon from which the dice were fabricated was 20–40 ohm-centimeters.

Before the units were aged, they were coated with a thin layer of silicone varnish material. The glass coating 19 is impervious to moisture, but if no hydrophobic material is provided over the glass there is a possibility that moisture condensing on the surface of the glass will produce an external short circuit between the contacts 17 and 18. The silicone material is more hydrophobic than the glass, and thus such external shorting is less likely to occur when the glass-coated units have a thin overcoat of silicone varnish.

The units with the lead silicate glass coating and an overcoating of silicone varnish were aged initially at 77° C. and 90% relative humidity. After 300 hours of aging, the temperature and humidity were varied continuously between 99° C., 70% relative humidity and 30° C., 70% relative humidity. Reverse current readings taken at 99° C. are presented in Table IV, and this data shows that the severe high humidity and high temperature conditions did not degrade the reverse current of the units even after 1800 hours of aging.

TABLE IV.—HIGH HUMIDITY AGING DATA, Si —O— Pb GLASS WITH VARNISH OVERCOAT ON SILICON RECTIFIER UNITS

| | Reverse Current (Microamps) at 77° C., 90% Relative Humidity, 200 Volts Bias | | Reverse Current (Microamps) at 99° C. and 70% Relative Humidity With 200 Volts Reverse Bias. Cycling to 30° C. and 70% Relative Humidity at 3 Hrs. Per Cycle | | | |
|---|---|---|---|---|---|---|
| Sample No. | Initial | 300 Hrs. | Initial | 500 Hrs. | 1,000 Hrs. | 1,800 Hrs. |
| 1 | 5 | 4 | 35 | 22 | 31 | 19 |
| 2 | 2 | 67 | 1.8 | 9.5 | 8.8 | 10 |
| 3 | 10 | 3 | 1.2 | 8 | 4 | 8 |
| 4 | 1.5 | 7 | 22 | 20 | 9.5 | 12 |

GLASS COATING OF GERMANIUM SEMI-CONDUCTOR UNITS

Protective glass films may be formed on germanium semiconductor units in the same manner as discussed above in connection with silicon units. In the germanium-oxygen system it has been found that germanium monoxide volatilization predominates the oxidation reaction above 550° C. By accelerating the oxidation in the manner discussed above, it is possible to build up suitable film thicknesses at temperatures below 550° C. The materials and mixtures of materials which form the glasses listed above may be used as the accelerating agent. Up to the present time the best results have been obtained using a mixture of lead-oxide and lead-bromide as the accelerating agent, and vapors of these lead compounds are introduced into the oxidizing atmosphere to form the glass film.

Figure 5:
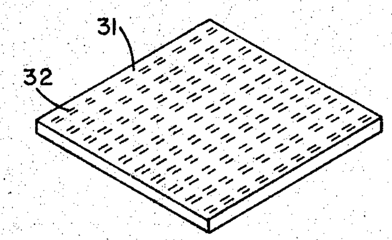
FIG. 5 is a perspective view of a slab of germanium which has many pairs of contacts on it, and which can be provided with a glass coating and then divided up into individual die units for transistor devices.

FIG. 5 shows a slab of germanium material of the type which is prepared in the fabrication of certain diffused base transistors. The slab 31 has a diffused junction in it and there are many pairs of metallic electrodes 32 on its surface. The slab 31 is divided up into individual die units of the type shown schematically in FIG. 6. A diffused junction 33 is represented by a dotted line 33 in FIG. 6, and there is an emitter electrode 34 and a base electrode 35 on the raised central portion of the die. These two electrodes 34 and 35 correspond to one of the pairs of electrodes 32 identified in FIG. 5.

Figure 6:
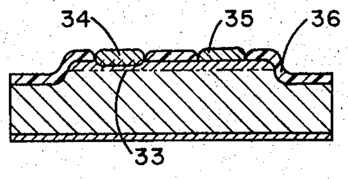
FIG. 6 is a sectional view of a glass-coated die unit for a germanium transistor which is typical of the die units provided by forming glass on the slab of FIG. 5 and then dividing it.

A glass coating 36 may be formed over the entire slab 31 by accelerated oxidation, and when the slab is divided up into dice of the type shown in FIG. 6, the glass coating protects the exposed portion of the junction 33. The thickness of the glass coating is greatly exaggerated in FIG. 6, and this is necessary in order to show the glass at all. The glass is so thin that it would not be visible on a drawing to scale.

In order to form the glass coating 36, the slab 31 may be supported in a furnace with the electrodes 32 facing a quantity of the accelerating material which is placed in the furnace in powdered form. In order to form a lead germanate glass, the accelerating material may be lead oxide. Protective glass films have been formed advantageously using a mixture of lead oxide and a lead halide as the accelerating material. A mixture of 50% lead oxide and 50% lead bromide used as the source of the accelerating agent has provided high quality glass films. The vapors from the powdered material mingle with air or other suitable oxygen-containing gas in the furnace, and they circulate over the face of the slab having the electrodes 32 on it. Suitable film thicknesses may be formed at temperatures of from about 350° C. to 450° C. for a time of from one to four hours.

It may be seen from the foregoing description that the invention constitutes a practical and advantageous method for fabricating glass-coated semiconductor devices which do not necessarily have to be hermetically sealed in containers. The glass coating can be formed at the surface of a body of silicon or germanium at substantially lower temperatures than has been possible with prior art techniques. Because of the low temperature of the processing, electrodes can be applied to the semiconductor unit before it is oxidized without unduly degrading the electrodes during the oxidation process. The low temperature oxidation also minimizes diffusion of doping impurities in the semiconductor material during the oxidation processing, thereby insuring that the electrical parameters of the device are not adversely altered.

Although the protection and stabilization of semiconductor units represent a major application of the invention, it can be applied to the fabrication of semiconductor devices in several ways. For example, it is possible to modify the electrical nature of a semiconductor surface by techniques which have been referred to in a general sense as "surface doping." A glass film formed by accelerated oxidation as described above can include a component which modifies the so-called surface states of the underlying semiconductor material, and special types of devices can be designed which take advantage of this effect.

We claim:

1. A process of forming an inorganic glass coating on semiconductor material selected from the group consisting of germanium and silicon, which process comprises thermally oxidizing the semiconductor material at a surface region thereof in an oxidizing atmosphere containing oxygen and a lead material at a temperature in the range from 400° C. to 750° C. with the lead material becoming incorporated in the glass, said lead material being selected from the group consisting of lead, lead oxide and lead halides.

2. A process of forming a protective inorganic glass coating on a body of semiconductor material which process comprises exposing a surface region of said semiconductor body to an oxidizing atmosphere containing oxygen and a lead material in vapor form and heating said semiconductor body in said atmosphere at a temperature in the range from 400° C. to 750° C. until a glass coating of a desired thickness has formed on said semiconductor body, said lead material being selected from the group consisting of lead, lead oxide and lead halides.

3. A process of forming an inorganic glass coating on a semiconductor element having a junction therein extending to a surface of said element, said process comprising exposing said element to an atmosphere containing oxygen and vapors of lead oxide and concurrently heating said semi-conductor element at a temperature in the range from 400° C. to 750° C. to form a lead oxysilicate glass coating at the surface of said semiconductor element and covering said junction, and retaining said glass coating on said element to protect said element.

4. The process of claim 3 in which said oxidizing atmosphere contains lead oxide and further contains at least one of the elements in vapor form selected from the group consisting of boron, aluminum, gallium, indium and thallium.

5. The process of claim 3 in which said oxidizing atmosphere contains lead oxide and further contains at least one of the elements in vapor form selected from the group consisting of phosphorus, arsenic, antimony and bismuth.

6. A process of forming an inorganic glass coating on semiconductor material which comprises thermally oxidizing the semiconductor material at a surface region thereof by exposing said surface region to an atmosphere containing oxygen and a mixture of lead oxide and lead halide in vapor phase, and heating the semiconductor material in said atmosphere at a temperature in the range from 400° C. to 750° C. until a glass coating of desired thickness forms at said surface region.

7. A process of forming an inorganic glass coating on semiconductor material which comprises thermally oxidizing said semiconductor material at a surface region thereof by exposing said surface region to an oxidizing atmosphere containing oxygen and a mixture of lead oxide and antimony oxide in vapor form, and heating said semiconductor material in said atmosphere at a temperature in the range from 400° C. to 750° C. until a glass coating of desired thickness has formed at said surface region.

References Cited by the Examiner

UNITED STATES PATENTS 2,957,789 10/1960 Pell -------------- 117—200 X

RALPH S. KENDALL, *Primary Examiner.*

A. L. LEAVITT, W. L. JARVIS, *Assistant Examiners.*